United States Patent
Zhong et al.

(10) Patent No.: US 7,173,803 B2
(45) Date of Patent: *Feb. 6, 2007

(54) LOW IMPEDANCE INTER-DIGITAL CAPACITOR AND METHOD OF USING

(75) Inventors: Dong Zhong, Chandler, AZ (US); Jiangqi He, Chandler, AZ (US); Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/837,814

(22) Filed: May 3, 2004

(65) Prior Publication Data

US 2004/0209518 A1    Oct. 21, 2004

Related U.S. Application Data

(63) Continuation of application No. 10/112,588, filed on Mar. 28, 2002, now Pat. No. 6,731,493.

(51) Int. Cl.
*H01G 4/005* (2006.01)
(52) U.S. Cl. ............... 361/303; 361/306.1; 361/306.3; 361/311; 361/313; 361/321.2; 439/69; 439/71; 439/620
(58) Field of Classification Search ............. 361/306.1, 361/306.2, 306.3, 321.2, 321.5, 328–330; 439/69–71, 620
See application file for complete search history.

(56) References Cited

U.S. PATENT DOCUMENTS

| | | | |
|---|---|---|---|
| 4,734,818 A | 3/1988 | Hernandez et al. | 361/306 |
| 5,272,590 A | 12/1993 | Hernandez | 361/306.2 |
| 5,369,545 A * | 11/1994 | Bhattacharyya et al. | 361/306.2 |
| 5,444,298 A | 8/1995 | Schutz | 257/691 |
| 5,590,016 A | 12/1996 | Fujishiro et al. | 361/313 |
| 5,648,679 A | 7/1997 | Chillara et al. | 257/666 |
| 5,971,808 A * | 10/1999 | Chiang et al. | 439/654 |
| 6,175,241 B1 * | 1/2001 | Hembree et al. | 324/755 |
| 6,362,948 B1 | 3/2002 | Moriwaki et al. | 361/308.1 |
| 6,407,906 B1 | 6/2002 | Ahiko et al. | 361/306.1 |
| 6,575,766 B1 * | 6/2003 | Xie et al. | 439/70 |
| 6,709,277 B2 * | 3/2004 | Ruttan et al. | 439/66 |
| 6,731,493 B2 * | 5/2004 | Zhong et al. | 361/303 |
| 6,936,917 B2 * | 8/2005 | Lopata et al. | 257/704 |
| 2002/0079912 A1 | 6/2002 | Shahriari et al. | 324/755 |
| 2003/0119341 A1 * | 6/2003 | Zhong et al. | 439/70 |

* cited by examiner

*Primary Examiner*—Nguyen T. Ha
(74) *Attorney, Agent, or Firm*—Schwegman, Lundberg, Woessner & Kluth, P.A.

(57) ABSTRACT

An inter-digital capacitor may be used in a power socket for a microelectronic device. In one embodiment an integrated, low-resistance power and ground terminal configuration is disclosed. The capacitor plates are alternatively coupled to the power and ground terminals. Two polarity types are disclosed. A method of operation is also described.

12 Claims, 7 Drawing Sheets

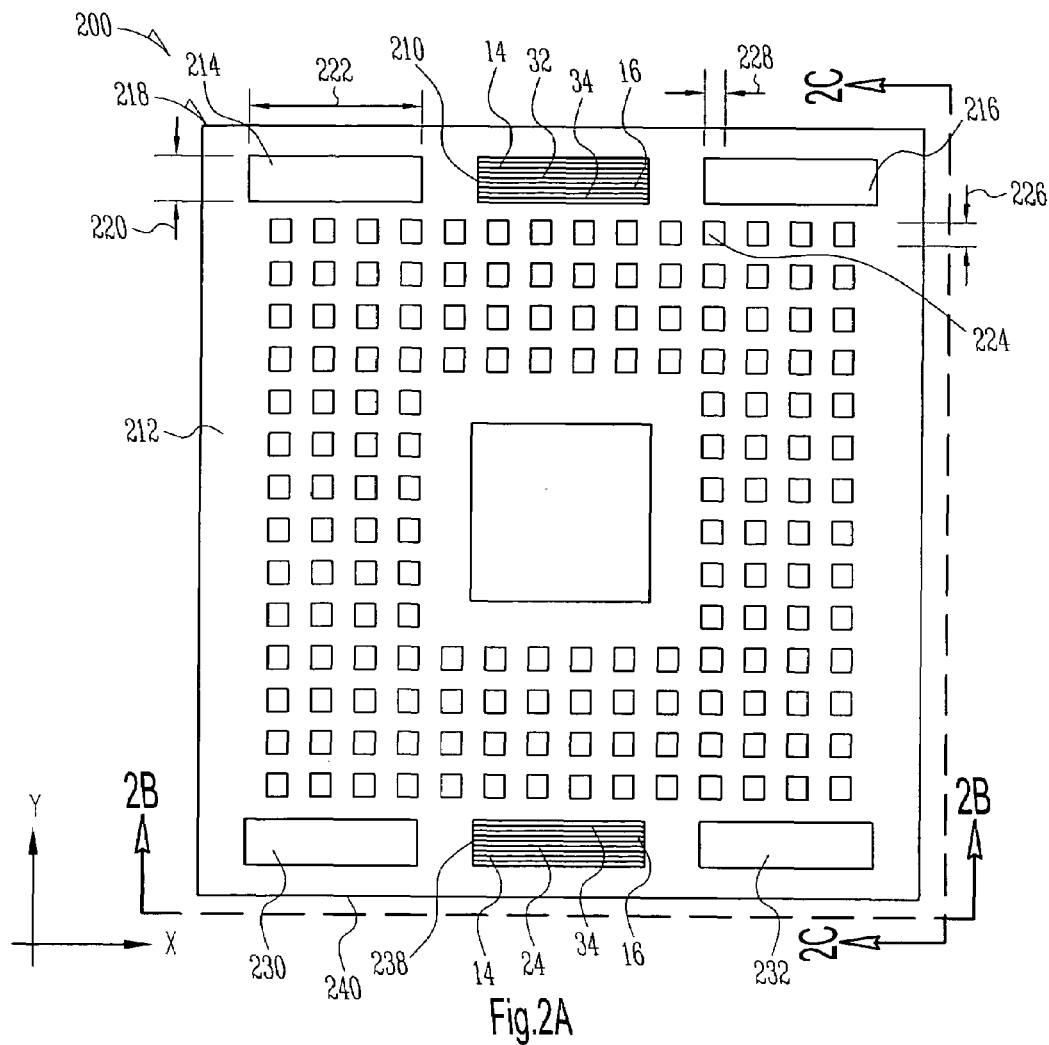
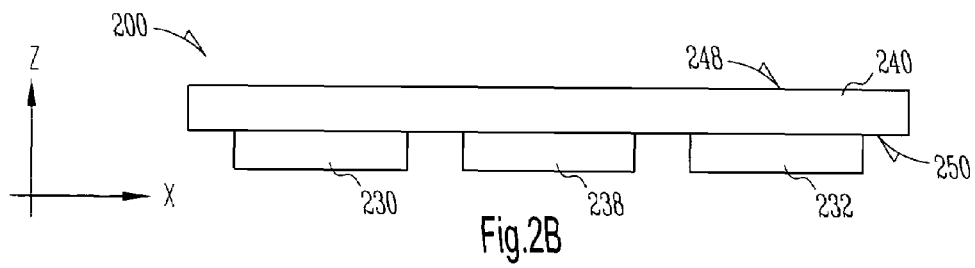
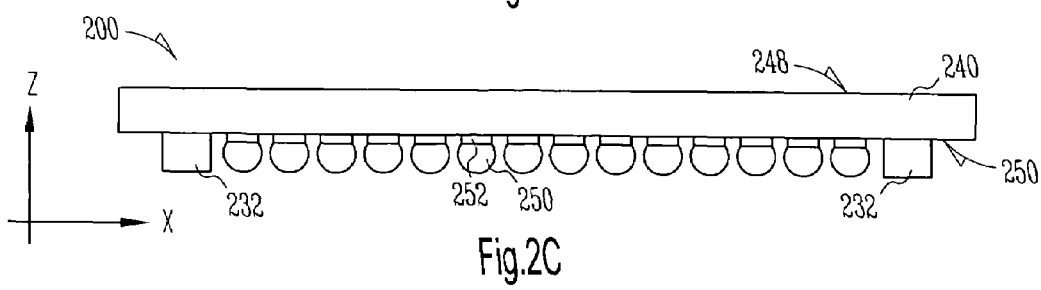
Fig.2A
Fig.2B
Fig.2C

LOW IMPEDANCE INTER-DIGITAL CAPACITOR AND METHOD OF USING

This application is a continuation of U.S. patent application Ser. No. 10/112,588, filed on Mar. 28, 2002, now issued as U.S. Pat. No. 6,731,493, which is incorporated herein by reference.

TECHNICAL FIELD

An embodiment of the present invention relates to a microelectronic device inter-digital capacitor (IDC). More particularly, an embodiment of the present invention relates to the use of a low-resistance IDC in connection with a high-power socket for a microelectronic device such as a processor. In particular, an embodiment of the present invention relates to a low inductance path and optionally a low resistance path for power delivery through the socket.

BACKGROUND INFORMATION

Description of Related Art

Chip packaging requires high-power sockets for devices such as processors and application-specific integrated circuits (ASICs). A processor requires a high current to enable multiple-gigahertz clock cycles to be achieved and to enable a variety of logic and memory operations to be simultaneously executed. High currents through sockets require low resistances in order to minimize power dissipation that is otherwise caused by resistance heating. Larger power dissipations in the socket result in higher socket temperatures, which in turn slow and ultimately defeat the device. Additionally, a high inductance is often generated in the power socket. Overall, the impedance (the voltage-to-current ratio) also affects the performance of the microelectronic device. An unacceptably high impedance will degrade both the signal and increase the resistance heating. When such a heating problem occurs, processor speed is slowed, or worse, the device fails with the result of lost data and lost productivity.

One way to deal with the challenges created by high current draw is to use more input/output (I/O) pins for the current draw. This allows a larger cumulative cross-sectional area to carry the power current, but the result is added cost, and even more scarce I/O real estate on the footprint of the power socket. Further, where the number of pins added to the power dissipation load does not provide a significantly lowered resistance than the resistance of the pins in the more active regions of the processor, the effectiveness of the additional pins may not be sufficient to reduce the current flowing through a given region of the socket. Additionally, the added pins must provide an effective direct current (DC) shunt capability but they limit the I/O capability because they could otherwise carry signals instead of power.

BRIEF DESCRIPTION OF THE DRAWINGS

In order that the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the embodiments of the invention will be described and explained with additional specificity and detail through the use of the accompanying drawings in which:

FIG. 2A is a top plan of a low-impedance power socket according to an embodiment;

FIG. 2B is an elevational view of the socket depicted in FIG. 2A;

FIG. 2C is an elevational view of the socket depicted in FIG. 2A;

DETAILED DESCRIPTION

One embodiment of the present invention relates to a low impedance inter-digital capacitor (IDC) that may be employed with a power socket for a microelectronic device such as a processor. In one embodiment, a low resistance and low inductance path is provided for power delivery through the power socket to the processor or microelectronic device that is being serviced by the power socket.

The following description includes terms, such as upper, lower, first, second, etc. that are used for descriptive purposes only and are not to be construed as limiting. The embodiments of a device or article of the present invention described herein can be manufactured, used, or shipped in a number of positions and orientations. The terms "die" and "processor" generally refer to the physical object that is the basic workpiece that is transformed by various process operations into the desired integrated circuit. A die is typically made of semiconductive material that has been singulated from a wafer after integrated processing. Wafers may be made of semiconducting, non-semiconducting, or combinations of semiconducting and non-semiconducting materials.

Reference will now be made to the drawings wherein like structures will be provided with like reference designations. In order to show the structures of embodiments of the present invention most clearly, the drawings included herein are diagrammatic representations of inventive articles. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
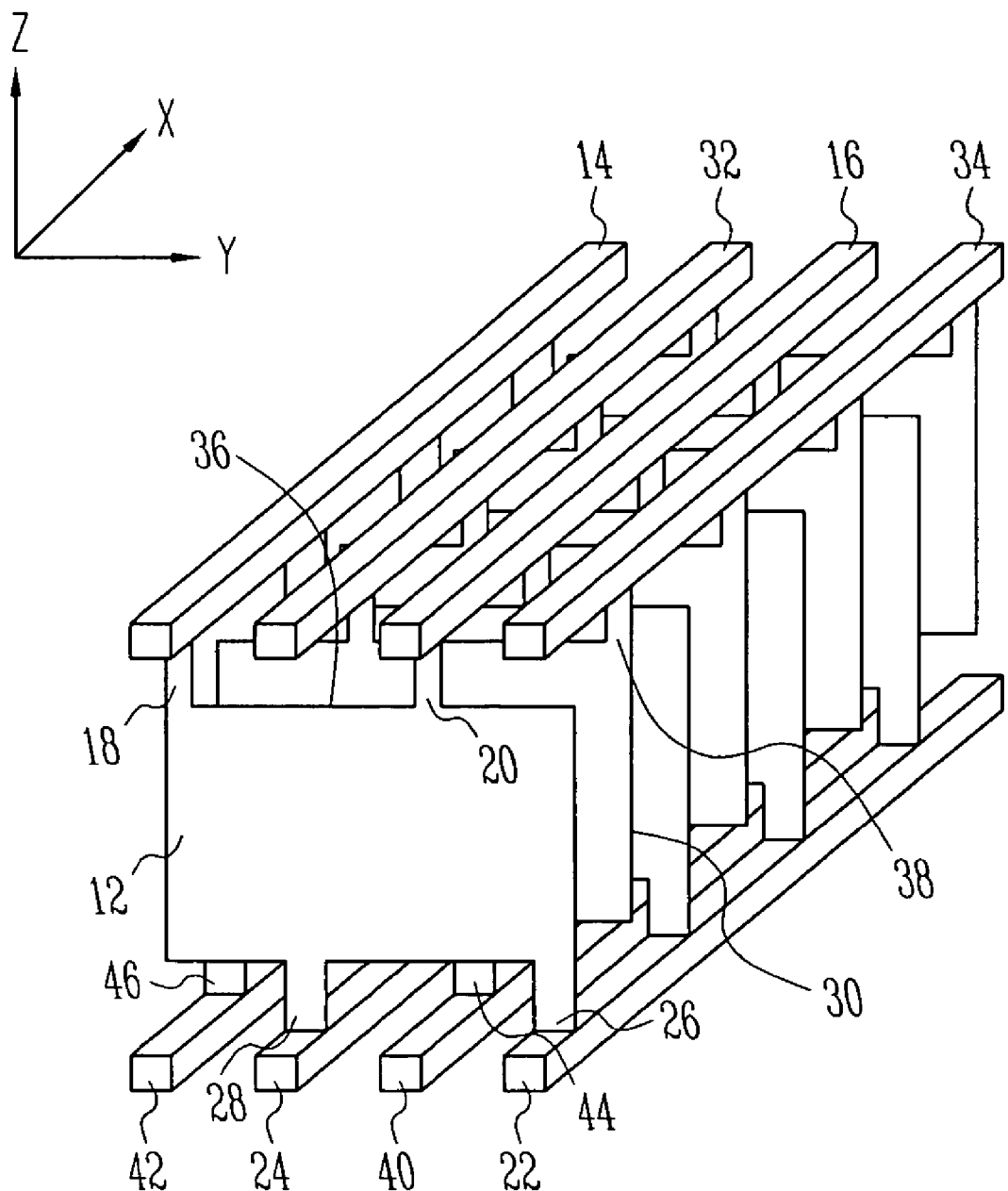
FIG. 1 is a perspective view of a vertical inter-digital capacitor according to an embodiment.

FIG. 1 is a perspective view of a vertical inter-digital capacitor according to an embodiment;

FIG. 2A is a top plan view of a low-impedance power socket according to an embodiment. FIG. 1 illustrates an inter-digital capacitor 10 according to an embodiment. According to an embodiment, the inter-digital capacitor (IDC) 10 includes capacitor plates that are vertically (orthogonally) oriented to the major planar surface of a power socket into which the IDC 10 is installed. Accordingly, as depicted in FIG. 1, a capacitor plate 12 is oriented coplanar in the Y-Z plane and orthogonal to the X-Y plane.

In this embodiment, a first capacitor plate 12 is assigned a power plate designation. The power capacitor first plate 12 is coupled to a first power connector 14 and to a second power connector 16 at the top side thereof, and electrical connection is made by a first power tab 18 and a second power tab 20. At the bottom side thereof, power capacitor first plate 12 is coupled to a third power connector 22 and to a fourth power connector 24 at the bottom side thereof, and electrical connection is made by a third power tab 26 and a fourth power tab 28. By this configuration, first power tab 18 is most closely connected from the top to the bottom of IDC 10, diagonally across power capacitor first plate 12 to fourth power tab 28. This diagonal proximity may be referred to as a first polarity type.

A second capacitor plate 30 is assigned a ground plate designation. The ground capacitor second plate 30 is coupled to a first ground connector 32 and to a second ground connector 34 at the top side thereof, and electrical connection is made by a first ground tab 36 and a second ground tab 38. At the bottom side thereof, ground capacitor second plate 30 is coupled to a third ground connector 40 and to a fourth ground connector 42 at the bottom side thereof, and electrical connection is made by a third ground tab 44 and a fourth ground tab 46. Accordingly, the IDC 10 includes a series of alternating power and ground connectors on the top side and on the bottom side. The power and ground connectors are configured to make a connection with other structures such as an interposer on one side and a board on the other side.

It is noted by these embodiments, that the exact structure of the connection of the power plate to the power connectors, whether by a power tab or by a structure known in the art, may be selected according to the desired application.

It is noted that a plurality of alternating power and ground plates are depicted. According to an embodiment, the number of power and ground plates is in a range from about 4 (two power plates and two ground plates each) to about 10,000 (5,000 power plates and 5,000 ground plates each) or more, depending upon the thickness of the plates and the totality of space in the X-dimension. In one embodiment, the number of power and ground plates is in a range from about 100 to about 2,000. In one embodiment, the number of power and ground plates is in a range from about 400 to about 800. In one embodiment, spacing between a given power capacitor plate and a given ground capacitor plate is in a range from about 0.1 mils to about 0.5 mils. In another embodiment, the spacing is about 0.3 mils.

A dielectric material (not pictured) is placed between power capacitor first plate 12 and ground capacitor second plate 30 as well as all other adjacent plates. According to a known technique, the dielectric material may be interdisposed during a layering construction of the IDC. In one embodiment, the dielectric material is silica. In one embodiment, the dielectric material is a low-K material (meaning having a dielectric constant lower than that of silica) such as SiLK® made by Dow Chemical of Midland, Mich., or FLARE® made by AlliedSignal Inc. of Morristown, N.J.

FIG. 2A illustrates a high-current power socket 200 in a top plan view. The power socket 200 includes a socket platform 212 including a major planar surface that is depicted in the X-Y plane. In some applications, a lower inductance is desired during power delivery to an electronic device such as a general processor or an ASIC. A first power terminal 214 is disposed on the socket platform 212 and is spaced apart from a first ground terminal 216 along an upper edge 218 of the socket platform 212. Additionally, a first plurality of I/O pin sockets 224 is provided (but only one is referenced by numeral 224).

The first power terminal 214 includes a first cross-sectional area that is defined by a power terminal height 220 and a power terminal width 222. The power socket 200 also includes an input/output (I/O) pin socket 224 that includes a second cross-sectional area defined by an I/O pin socket height 226 and an I/O pin socket width 228. It is noted that the first cross-sectional area is larger than the second cross-sectional area. In one embodiment the ratio of the first cross-sectional area to the second cross-sectional area is from about 4:1 to about 50:1. In another embodiment, the ratio is from about 8:1 to about 40:1. In another embodiment, it is from about 16:1 to about 30:1. This cross-sectional area comparison may be a comparison of height 220 multiplied by the width 222, compared to the cross-sectional area of a pin (not pictured) that inserts into I/O pin socket 224 from a device such as an interposer (not pictured). The cross-sectional area may also be the surface area of contact within the locking mechanism (not pictured) within the I/O pin socket 224 as is known in the art.

In FIG. 2A, a second power terminal 230 and a second ground terminal 232 are present.

Where the bulk of the power current supplied to an electronic device that is attached to the power socket 200 passes first through the power terminals 214 and 230, and passes to ground through the ground terminals 216 and 232, significant inductance is avoided by the presence of a vertically oriented IDC such as IDC 10 illustrated in FIG. 1. As set forth herein, a vertically oriented IDC 210 is oriented such that its capacitative surfaces (e.g., capacitor plates) are arranged orthogonal to the X-Y plane. In other words, the capacitor plates are vertically oriented to the major planar surface. FIG. 2A also illustrates the top-side first and second power connectors 14 and 16, respectively, and the top-side first and second ground connectors 32 and 34, respectively, as viewable in FIG. 1.

Optionally and additionally, a second vertically oriented IDC 238 is disposed between second power terminal 230 and second ground terminal 232 at a lower edge 240 of power socket 200. Similar to the first IDC 210, the second vertically oriented IDC 238 also illustrates the top-side first and second power connectors 14 and 16, respectively, and the top-side first and second ground connectors 32 and 34, respectively, as viewable in FIG. 1.

FIG. 2B is an elevational view of the power socket 200, taken along the line 2B—2B from FIG. 2A. The power socket 200 in this view includes a major planar upper surface 248 and a major planar lower surface 250. FIG. 2B illustrates that both power 230 and ground 232 terminals extend below the major planar lower surface 250, as well as a second vertically oriented IDC 238. The degree to which the power and ground terminals as well as the capacitor(s) extend below major planar lower surface 250 is often determined by a specific application of the embodiment.

FIG. 2C is an elevational view of the power socket 200, taken along the line 2C—2C from FIG. 2A. Power socket 200 in this view includes the major planar upper surface 248 and the major planar lower surface 250. FIG. 2C illustrates both the first and second ground terminals 216 and 232, respectively, as they extend below major planar lower surface 250. FIG. 2C also illustrates a second plurality of electrical bumps 252 disposed at the major planar lower surface 250. In one embodiment, the electrical bumps 252 are mounted on a bond pad 254. In one embodiment, the bond pad 254 is set flush (not pictured) with the major planar lower surface 250. In one embodiment, the second plurality of electrical bumps 252 is equal to the first plurality of I/O pin sockets 224, depicted in FIG. 2A.

In a first example, power socket 200 includes an IDC 210 that is operated in a frequency range from about 1 MHz to about 3 GHz. The current draw is in a range from about 1 milliAmpere to about 20 Amperes. Accordingly, resistance is measured in a range from about 5 milli Ohms (mO) to about 6 mO, and the inductance is measured in a range from about 390 pico Henrys (pH) to about 450 pH.

In one embodiment, it is preferable to operate at a lower overall inductance than that displayed in the first example.

Figure 3:
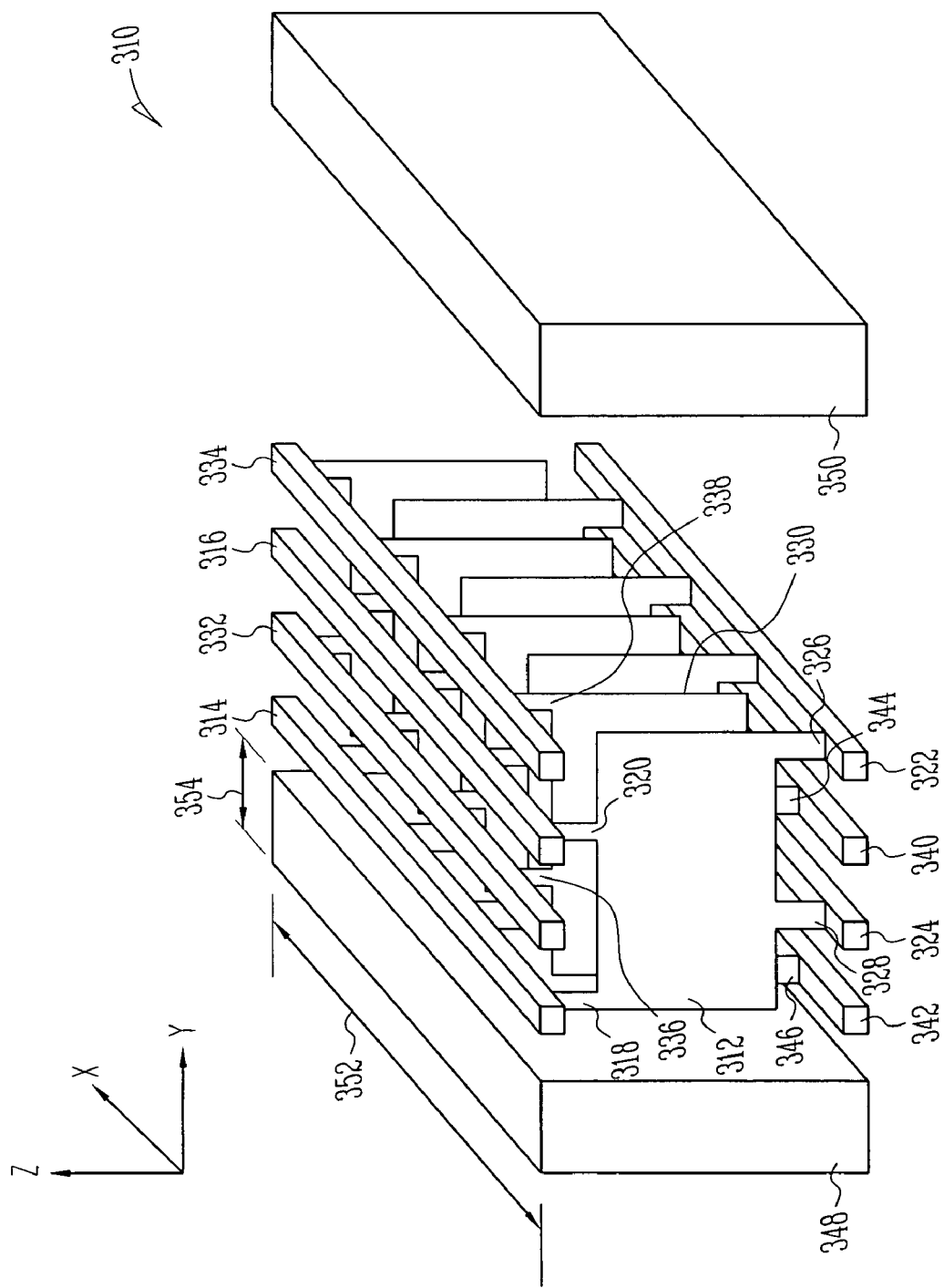
FIG. 3 is a perspective view of a low-impedance device that includes an inter-digital vertical capacitor that is integrated with low-resistance power and ground terminals.

FIG. 3 is a perspective view of another IDC 310 that includes integral power and ground terminals. The IDC 310 includes capacitor plates that are vertically oriented to the major planar surface of a power socket into which the IDC 310 is installed. Accordingly, as depicted in FIG. 3, a capacitor plate 312 is oriented coplanar in the Y-Z plane and orthogonal to X-Y plane.

In this embodiment, a first capacitor plate 312 is assigned a power plate designation. The power capacitor first plate 312 is coupled to a first power connector 314 and to a second power connector 316 at the top side thereof, and electrical connection is made by a first power tab 318 and a second power tab 320. At the bottom side thereof, power capacitor first plate 312 is coupled to a third power connector 322 and to a fourth power connector 324 at the bottom side thereof, and electrical connection is made by a third power tab 326 and a fourth power tab 328. By this configuration, first power tab 318 is most closely connected from the top to the bottom of IDC 310, diagonally across power capacitor first plate 312 to fourth power tab 328. This diagonal proximity may be referred to as a first polarity type.

A second capacitor plate 330 is assigned a ground plate designation. The ground capacitor second plate 330 is coupled to a first ground connector 332 and to a second ground connector 334 at the top side thereof, and electrical connection is made by a first ground tab 336 and a second ground tab 338. At the bottom side thereof, ground capacitor second plate 330 is coupled to a third ground connector 340 and to a fourth ground connector 342 at the bottom side thereof, and electrical connection is made by a third ground tab 344 and a fourth ground tab 346. Accordingly, the IDC 310 includes a series of alternating power and ground connectors on the top side and on the bottom side. The power and ground connectors are configured to make a connection with other structures such as an interposer on one side and a board on the other side.

Similar to IDC 10, depicted in FIG. 1, it is noted that a plurality of alternating power and ground plates is depicted. According to an embodiment and as set forth herein, the number of power and ground plates is in a range from about 4 to about 10,000 or more, depending upon the thickness of the plates and the totality of space in the X-dimension. In one embodiment, the number of power and ground plates is in a range from about 100 to about 2,000. In one embodiment, the number of power and ground plates is in a range from about 400 to about 800. In one embodiment, spacing between a given power capacitor plate and a given ground capacitor plate is in a range from about 0.1 mils to about 0.5 mils. In another embodiment, the spacing is about 0.3 mils.

In order to achieve an even lower resistance in a high-power socket (and accordingly, the lower overall impedance), this embodiment includes an integrated power terminal 348 and an integrated ground terminal 350. The integrated power terminal 348 is disposed on a first lateral boundary of the power and ground plates, and the integrated ground terminal 350 is disposed opposite, on a second lateral boundary. In FIG. 3, the ground terminal 350 appears in exploded form to further illustrate the power and ground plates. In one embodiment, the power plates, such as power capacitor first plate 312, are fabricated to make a connection with the power terminal 348. Similarly, the ground plates are fabricated to make a connection with the ground terminal 350.

Various cross-sectional areas of power terminal 348 and ground terminal 350 may be made in relation to the area of the power and ground capacitor plates. For example, the power terminal 348 includes a first cross-sectional area that is defined by a power terminal length 352 and a power terminal width 354. In one embodiment, the ratio of this cross-sectional area in relation to the area of an IDC plate is in a range from about 0.1:1 to about 2:1. In one embodiment, the ratio is in a range from about 0.2:1 to about 1.8:1. In one embodiment, the ratio is in a range from about 0.4:1 to about 1:1.

A dielectric material (not pictured) as set forth herein is placed between power capacitor first plate 312 and ground capacitor second plate 330.

Figure 4:
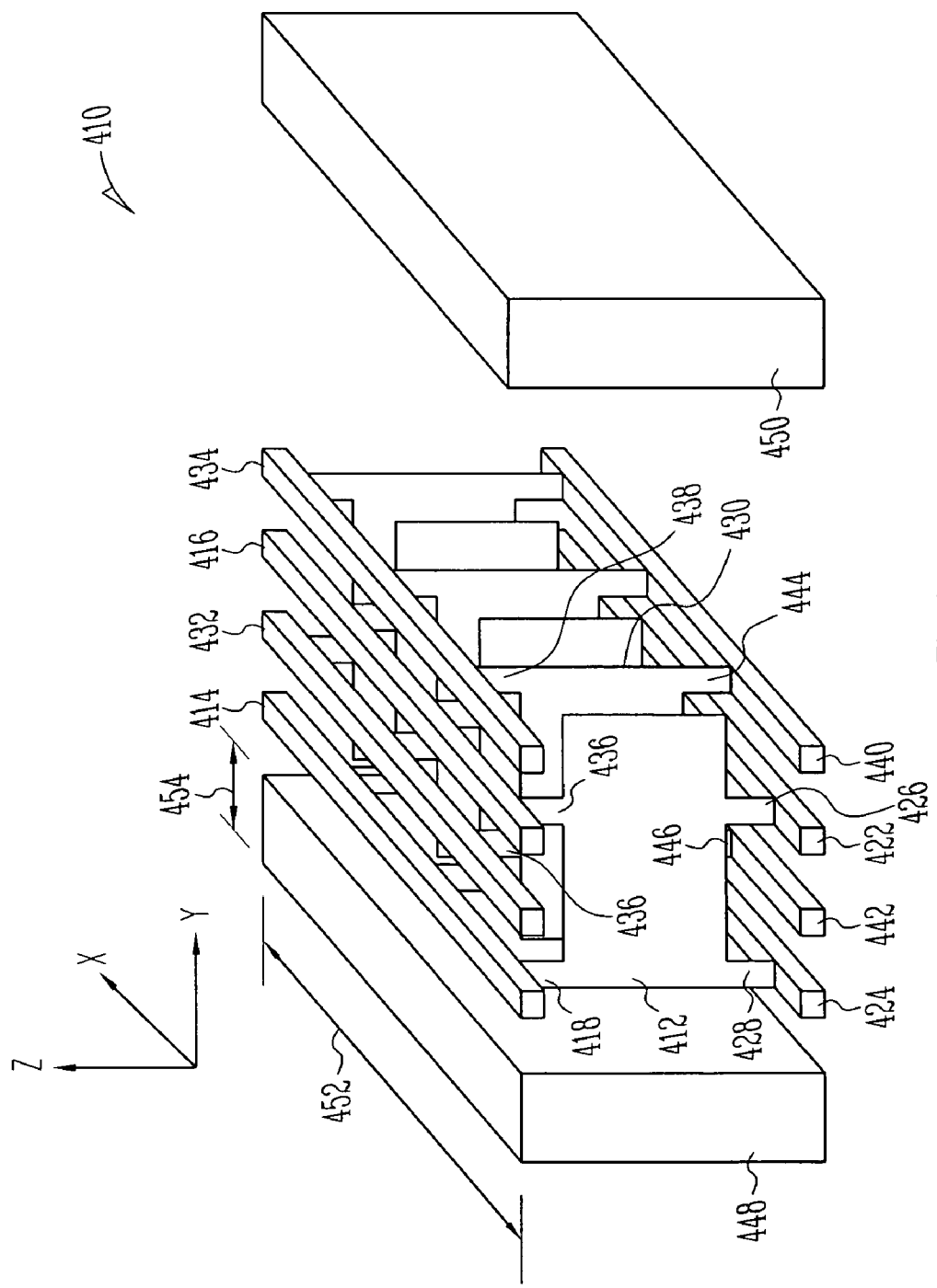
FIG. 4 is a perspective view of another low-impedance device that includes an inter-digital vertical capacitor that is integrated with low-resistance power and ground terminals.

FIG. 4 is a perspective view of another IDC 410 that includes integral power and ground terminals. The IDC 410 includes capacitor plates that are vertically oriented to the major planar surface of a power socket into which the IDC 410 is installed. Accordingly, as depicted in FIG. 4, a capacitor plate 412 is oriented coplanar in the Y-Z plane and orthogonal to the X-Y plane.

In this embodiment, a first capacitor plate 412 is assigned a power plate designation. The power capacitor first plate 412 is coupled to a first power connector 414 and to a second power connector 416 at the top side thereof, and electrical connection is made by a first power tab 418 and a second power tab 420. At the bottom side thereof, power capacitor first plate 412 is coupled to a third power connector 422 and to a fourth power connector 424 at the bottom side thereof, and electrical connection is made by a third power tab 426 and a fourth power tab 428. By this configuration, first power tab 418 is most closely connected from the top to the bottom of IDC 410, substantially vertically across power capacitor first plate 412 to fourth power tab 428. This substantially vertical proximity may be referred to as a second polarity type.

A second capacitor plate 430 is assigned a ground plate designation. The ground capacitor second plate 430 is coupled to a first ground connector 432 and to a second ground connector 434 at the top side thereof, and electrical connection is made by a first ground tab 436 and a second ground tab 438. At the bottom side thereof, ground capacitor second plate 430 is coupled to a third ground connector 440 and to a fourth ground connector 442 at the bottom side thereof, and electrical connection is made by a third ground tab 444 and a fourth ground tab 446. Accordingly, the inventive IDC 410 includes a series of alternating power and ground connectors on the top side and on the bottom side. The power and ground connectors are configured to make a connection with other structures such as an interposer on one side and a board on the other side.

Similar to IDC 10 (FIG. 1) and IDC 310 (FIG. 3), it is noted that a plurality of alternating power and ground plates are depicted for IDC 410. According to an embodiment and as set forth herein, the number of power and ground plates is in a range from about 4 to about 10,000 or more, depending upon the thickness of the plates and the totality of space in the X-dimension. In one embodiment, the number of power and ground plates is in a range from about 100 to about 2,000. In one embodiment, the number of power and ground plates is in a range from about 400 to about 800. In one embodiment, spacing between a given power capacitor plate and a given ground capacitor plate is in a range from about 0.1 mils to about 0.5 mils. In another embodiment, the spacing is about 0.3 mils.

In order to achieve an even lower resistance in a high-power socket (and accordingly, the lower overall impedance), this embodiment includes an integrated power terminal 448 and an integrated ground terminal 450. In FIG. 4, the ground terminal 450 appears in exploded form to further illustrate the power and ground plates. In one embodiment, the power plates, such as power capacitor first plate 412, are fabricated to make a connection with the power terminal 448. Similarly, the ground plates are fabricated to make a connection with the ground terminal 450.

Various cross-sectional areas of power terminal 448 and ground terminal 450 may be made in relation to the area of the power and ground capacitor plates. For example, the power terminal 448 includes a first cross-sectional area that is defined by a power terminal length 452 and a power terminal width 454. In one embodiment, the ratio of this cross-sectional area in relation to the area of an IDC plate is in a range from about 0.1:1 to about 2:1. In one embodiment, the ratio is in a range from about 0.2:1 to about 1.8:1. In one embodiment, the ratio is in a range from about 0.4:1 to about 1:1.

A dielectric material (not pictured) as set forth herein is placed between power capacitor first plate 412 and ground capacitor second plate 430.

The implementation of either IDC 310 or IDC 410 into a high-power socket results in a significantly lowered impedance.

In a second example, all conditions of the first example are repeated with the addition that an IDC 310 of the first polarity type is used that includes the integral power and ground terminals 348 and 350, respectively. Where a resistance of about 5.44 mOhm was experienced in IDC 10, the resistance in IDC 310 is about 0.619 mOhm. Where an inductance of about 418 picoHenrys was experienced, the resistance in IDC 310 is about 315 picoHenrys. Accordingly, a much lowered impedance has been achieved.

Figure 5A:
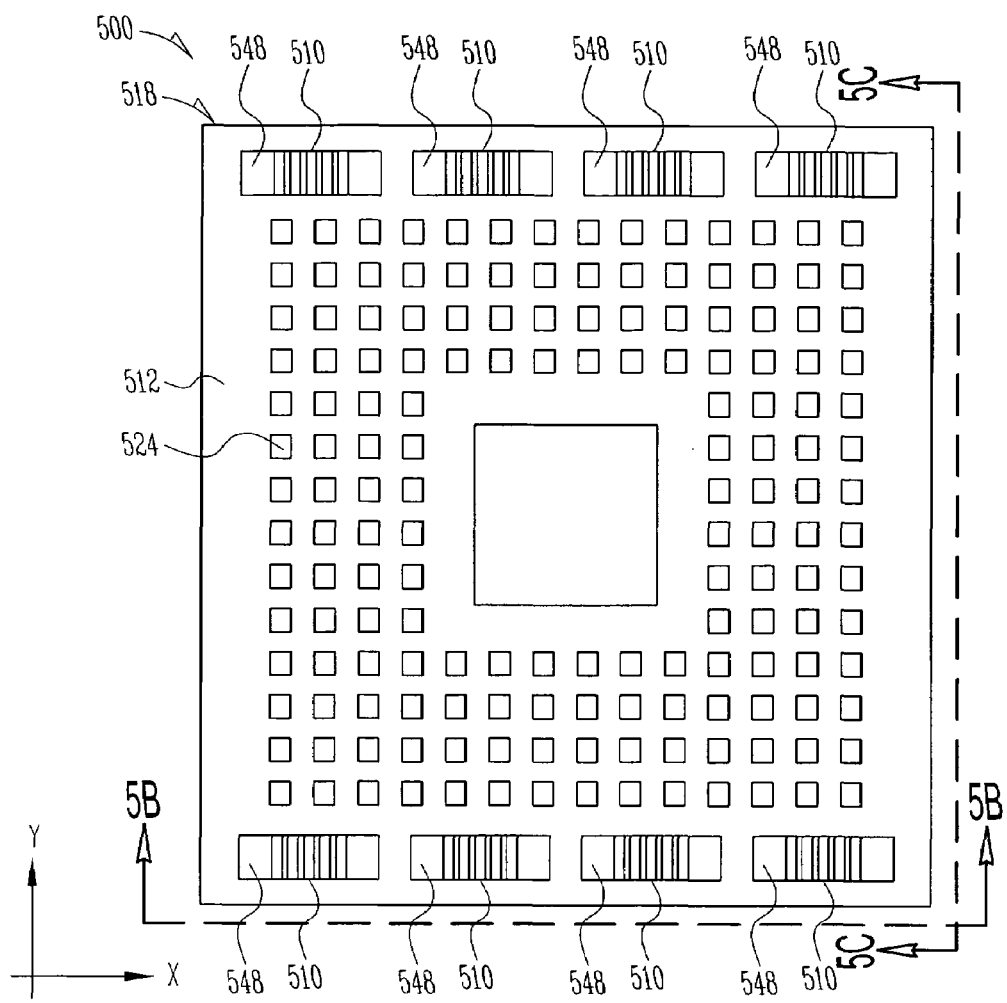
FIG. 5A is a top plan of a low-impedance power socket according to an embodiment.

FIG. 5A is a top plan of an embodiment of a high-power socket 500 wherein an IDC 510 has been installed. This may be an IDC such as IDC 310 or IDC 410. The high-power socket 500 includes a socket platform 512 including a major planar surface that is depicted in the X-Y plane. A plurality of IDCs 510 is installed in the high-power socket 500. Additionally, a first plurality of I/O pin sockets 524 is provided. In one embodiment, the ratio of areas for the integrated power terminals to the I/O pin sockets is the same as for other embodiments set forth herein. It is noted that the first cross-sectional area of the power terminal 548 on IDC 510 is larger than the second cross-sectional area of one of the I/O pin sockets 524.

Figure 5B:
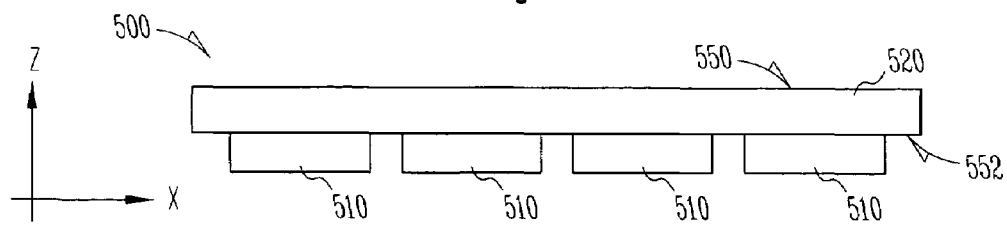
FIG. 5B is an elevational view of the socket depicted in FIG. 5A.

FIG. 5B is an elevational view of the power socket 500, taken along the line 5B—5B from FIG. 5A. The power socket 500 in this view includes a major planar upper surface 550 and a major planar lower surface 552. FIG. 5B illustrates that the IDCs 510 extend below the major planar lower surface 552. The degree to which the IDCs extend below major planar lower surface 552 is often determined by a specific application of the embodiment.

Figure 5C:
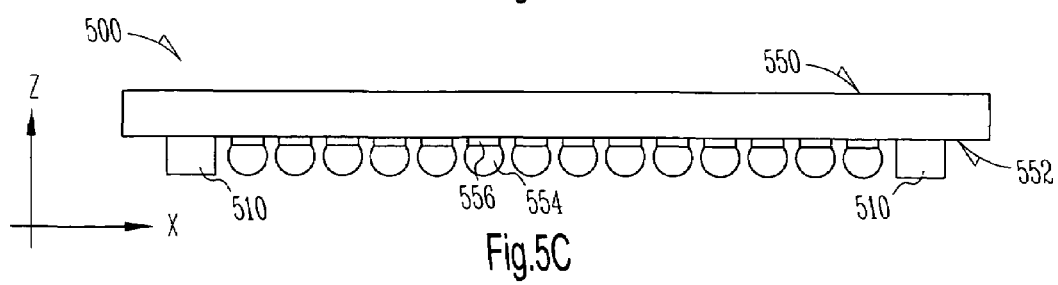
FIG. 5C is an elevational view of the socket depicted in FIG. 4A.

FIG. 5C is an elevational view of the power socket 500, taken along the line 5C—5C from FIG. 5A. Power socket 500 in this view includes the major planar upper surface 550 and the major planar lower surface 552. FIG. 5C also illustrates a second plurality of electrical bumps 554 disposed at the major planar lower surface 552. In one embodiment, each electrical bump 554 is mounted on a bond pad 556. In one embodiment, the bond pad 556 is set flush (not pictured) with the major planar lower surface 552. In one embodiment, the second plurality of electrical bumps 554 is equal to the first plurality of I/O pin sockets 524, depicted in FIG. 5A.

By these disclosures, it will be apparent that a combination may be constructed that includes an ICD 10 from FIG. 1, with an IDC 310 or an IDC 410. Similarly, where IDC 10 is of a first polarity type, an IDC of a second polarity type may replace IDC 10 in some applications. This similarity is illustrated by comparing IDC 310 with IDC 410. Further, combination of an IDC or various IDCs in this disclosure may be made with dedicated power and ground terminals such as power terminal 214 and ground terminal 216. The specific placement of the various components in the platform of a power socket may be selected according to a specific application.

Figure 6:
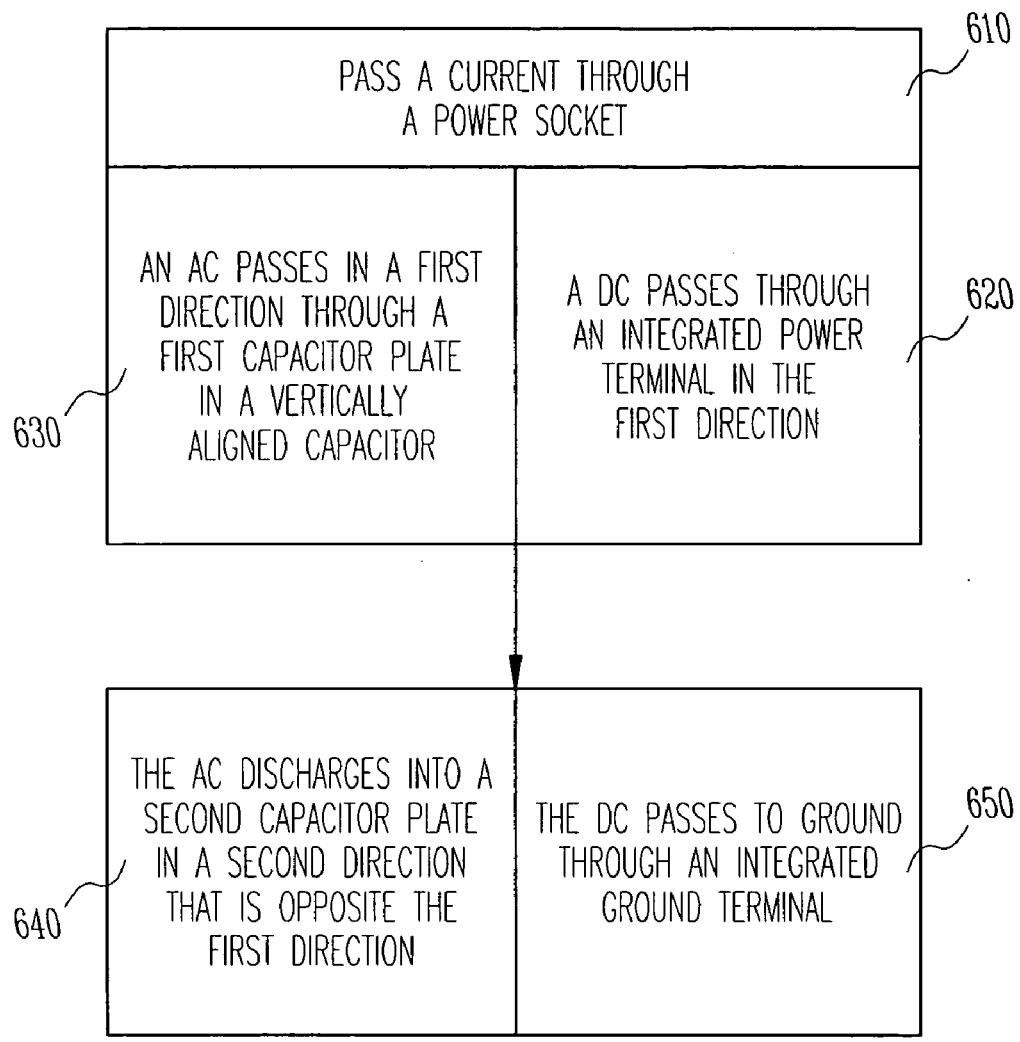
FIG. 6 is a method flow diagram according to an embodiment.

FIG. 6 is a method flow diagram according to an embodiment. According to a method embodiment, a method of operating a device is depicted in FIG. 6. In 610, the method commences by passing a current through a power socket. The current may include an alternating first current and a direct second current. In 620, the direct second current passes in the first direction through an optionally integrated power terminal. In 630, the alternating first current passes in a first direction through a first inter-digital capacitor plate that is configured in a plane collinear with the first direction. In 640, at certain frequencies, the alternating first current discharges into a second inter-digital capacitor plate and conducts in a second direction that is substantially opposite to the first direction. For example, the frequency is in a range from about 1 GHz to about 10 GHz. As set forth herein, the second inter-digital capacitor plate is spaced apart and immediately adjacent the first inter-digital capacitor plate. The proximity of the first and second inter-digital capacitor plates and the vertical loop inductance, surrounded by the plurality of optionally integrated power and ground plates, results in an inductance in a range below about 0.1 pico Henry/square. In another embodiment, the inductance is from about 0.01 pico Henry/square to about 0.06 pico Henry/square. In another embodiment, the inductance is about 0.03 pico Henry/square. Further operations in the method include, in 650, the direct second current passing to ground through an optionally integrated ground terminal in the second direction. One advantage of these embodiments is that the overall impedance is reduced by the concerted presence of the power and ground terminal(s) and the vertically oriented capacitor(s).

The following is a method example. Reference may be made to the structure depicted in FIGS. 2A–2C. A DC current in the range from about 1 milliAmpere to about 20 Ampere passes through power terminals 14 and 30. An AC current in the range from about 1 microAmpere to about 5 Ampere passes through the vertical capacitors 132 and 138 at a frequency of in a range from about 1 MHz to about 3 GHz. Total inductance in power socket 110 is in a range from about 50 picoHenry to about 800 picoHenry. Total impedance in this range is from about 0.1 mOhm to about 100 mOhm.

Figure 7:
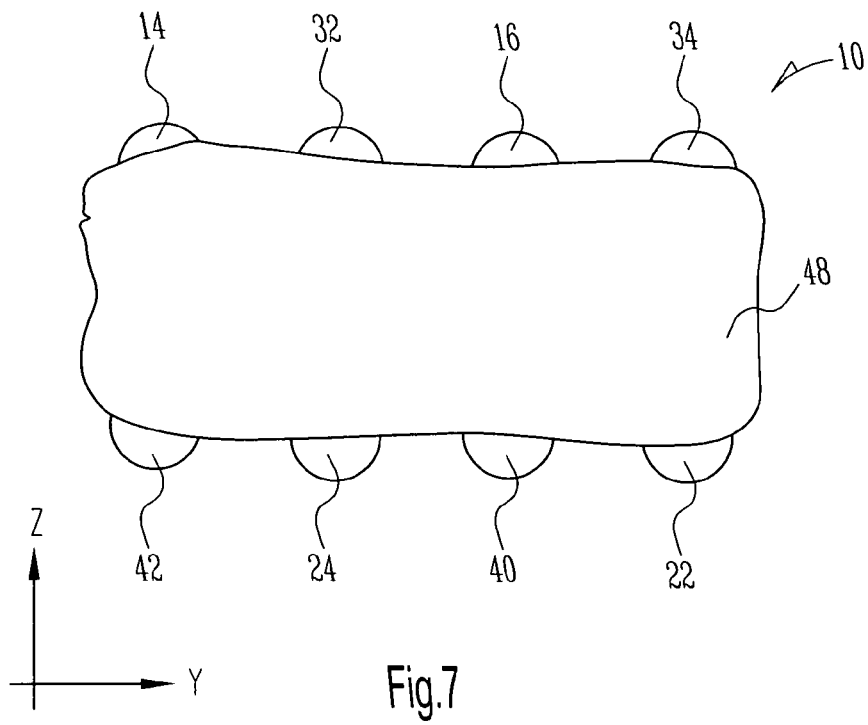
FIG. 7 is an elevational side view of a packaged inter-digital capacitor according to an embodiment.

FIG. 7 is an elevational view of a packaged IDC 10 such as the structure depicted in FIG. 1 after packaging. An encapsulation material 48 is depicted as protecting the power and ground capacitor plates and exposing the power connectors 14, 16, 22, and 24, and the ground connectors 32, 34, 40, and 42. It is noted that the IDC 10 has been rotated such that the power and ground connectors are orthogonal to the plane of the page. It is further noted that the IDC 10 is of the first polarity type.

Figure 8:
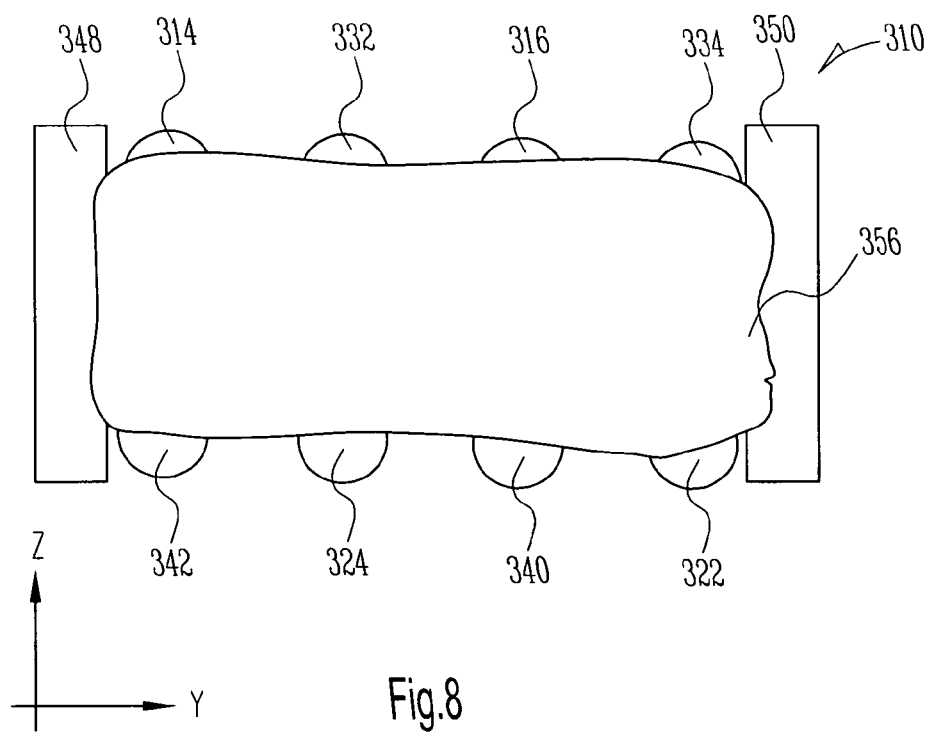
FIG. 8 is an elevational side view of a packaged inter-digital capacitor according to an embodiment.

FIG. 8 is an elevational view of a packaged IDC 310 such as the structure depicted in FIG. 3 after packaging. An encapsulation material 356 is depicted as protecting the power and ground capacitor plates and exposing the power connectors 314, 316, 322, and 324, and the ground connectors 332, 334, 340, and 342. Additionally, the power terminal 348 and the ground terminal 350 are exposed beyond the encapsulation material 356. It is noted that the IDC 310 has been rotated such that the power and ground connectors are orthogonal to the plane of the page. It is further noted that the IDC 310 is of the first polarity type.

With respect to the IDCs depicted in FIGS. 7 and 8 (as well as IDCs with different polarities), they are installable into a power socket platform as set forth in this disclosure.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

While certain elements have been described herein relative to "upper" and "lower", "left" and "right", and "front" and "back", it will be understood that these descriptors are relative, and that they could be reversed if the elements were inverted, rotated, or mirrored. Therefore, these terms are not intended to be limiting.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A power socket comprising:
    a plurality of input/output (I/O) pin sockets in a socket platform, wherein the socket platform includes a major planar surface; and
    an inter-digital capacitor in the socket platform, the inter-digital capacitor further including:
    an integrated power terminal;
    an integrated ground terminal;
    a power capacitor first plate;
    a ground capacitor second plate spaced apart from the first plate;
    at least one top power connector coupled to the power capacitor first plate;
    at least one top ground connector coupled to the ground capacitor second plate;
    at least one bottom power connector coupled to the power capacitor first plate;
    at least one bottom ground connector coupled to the ground capacitor second plate;
    wherein the power capacitor first plate is part of a plurality of power capacitor plates, and wherein the ground capacitor first plate is part of a plurality of ground capacitor plates;
    a dielectric material that is interdisposed between the power capacitor first plates and the ground capacitor second plates; and
    an encapsulation material that exposes the at least one top power connector, the at least one top ground connector, the at least one bottom power connector, the at least one bottom ground connector, and the integrated power and ground terminals.

2. The power socket according to claim 1,
    wherein the integrated power terminal is disposed on a first lateral boundary of the capacitor plates, wherein the integrated ground terminal is disposed on a second lateral boundary of the capacitor plates.

3. The power socket according to claim 1, wherein the at least one top power connector includes two top power connectors, wherein the at least one top ground connector includes two top ground connectors, wherein the at least one bottom power connector includes two bottom power connectors, and wherein the at least one bottom ground connector includes two bottom ground connectors.

4. The power socket according to claim 1, wherein the power capacitor plate is part of a plurality of power capacitor plates, and wherein the ground capacitor plate is part of a plurality of ground capacitor plates.

5. The power socket according to claim 1, wherein the power capacitor plate is part of a plurality of power capacitor plates, and wherein the ground capacitor plate is part of a plurality of ground capacitor plates, further including:
    a dielectric material that is interdisposed between the power capacitor first plates and the ground capacitor second plates.

6. The power socket according to claim 1, wherein the power capacitor first plate is part of a plurality of power capacitor plates, and wherein the ground capacitor second plate is part of a plurality of ground capacitor plates, and wherein the power capacitor plates and the ground capacitor plates each range in number from about 2 to about 5,000.

7. A power socket comprising:
    a socket platform including a major planar surface; and on the socket platform:
    a power terminal spaced apart from a ground terminal, wherein the power terminal includes a first cross-sectional area;

an input/output (I/O) pin socket, wherein the I/O pin socket includes a second cross-sectional area that is smaller than the first cross-sectional area; and an inter-digital capacitor that has capacitor plates vertically oriented to the major planar surface.

8. The power socket according to claim 7, wherein the socket platform includes a first edge and a second edge, wherein the power terminal includes two power terminals, wherein the ground terminal includes two ground terminals, wherein the two power terminals are symmetrically disposed along the first edge, and wherein the two ground terminals are symmetrically disposed along the second edge.

9. The power socket according to claim 7, further:

wherein the socket platform includes a first edge and a second edge;

wherein the power terminal includes a first power terminal and a second power terminal;

wherein the ground terminal includes a first ground terminal and a second ground terminal;

wherein the capacitor includes a first capacitor and a second capacitor;

wherein the first and second power terminals are symmetrically disposed along the first edge;

wherein the first and second ground terminals are symmetrically disposed along the second edge;

wherein the first and second capacitors are vertically oriented to the major planar surface;

wherein the first capacitor is disposed between the first power terminal and the first ground terminal; and wherein the second capacitor is disposed between the second power terminal and the second ground terminal.

10. The power socket according to claim 7, wherein the I/O pin socket is part of a plurality of pin sockets.

11. The power socket according to claim 7, wherein the capacitor includes an inter-digital capacitor of a first polarity type.

12. The power socket according to claim 7, wherein the capacitor includes an inter-digital capacitor of a second polarity type.

* * * * *